US011314351B2

(12) United States Patent
Jang et al.

(10) Patent No.: US 11,314,351 B2
(45) Date of Patent: Apr. 26, 2022

(54) TOUCH DISPLAY DEVICE

(71) Applicant: LG Display Co., Ltd., Seoul (KR)

(72) Inventors: Jae-Hyung Jang, Paju-si (KR); Min-Joo Kim, Seoul (KR); Jae-Won Lee, Goyang-si (KR); Sang-Hoon Pak, Seoul (KR); Sang-Hyuk Won, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/111,462

(22) Filed: Dec. 3, 2020

(65) Prior Publication Data

US 2021/0191553 A1 Jun. 24, 2021

(30) Foreign Application Priority Data

Dec. 24, 2019 (KR) .................. 10-2019-0173972

(51) Int. Cl.
*G06F 3/041* (2006.01)
*H01L 27/32* (2006.01)
*H01L 51/52* (2006.01)

(52) U.S. Cl.
CPC .......... *G06F 3/0412* (2013.01); *H01L 27/323* (2013.01); *H01L 51/5253* (2013.01); *G06F 2203/04111* (2013.01)

(58) Field of Classification Search
CPC .... G06F 3/0412; G06F 3/023; G06F 3/04164; G06F 2203/04103; G06F 2203/04107; G06F 2203/04111; G06F 3/041; G06F 3/044; G06F 3/0443; G06F 3/0446; G06F 3/04842; H01L 27/323
See application file for complete search history.

(56) References Cited

U.S. PATENT DOCUMENTS

2018/0151850 A1* 5/2018 Lee ..................... H01L 27/3246
2018/0158894 A1* 6/2018 Park .................... H01L 27/3276
2018/0182818 A1* 6/2018 Kim ..................... G06F 3/0446

OTHER PUBLICATIONS

European Search Report dated Jun. 8, 2021 issued in corresponding Patent Application No. 20210963.3 (10 pages).

* cited by examiner

*Primary Examiner* — Sanjiv D. Patel
(74) *Attorney, Agent, or Firm* — Polsinelli PC

(57) ABSTRACT

A touch display device for preventing damage to test patterns is configured such that a test cover layer, which is formed of the same material as at least one of a plurality of insulating films disposed between a light-emitting element and a touch electrode, is disposed on a test pattern formed on a peripheral portion of a substrate, thereby preventing damage to the test pattern during the process of manufacturing a touch sensor.

15 Claims, 7 Drawing Sheets

TOUCH DISPLAY DEVICE

CROSS REFERENCE TO RELATED APPLICATION

This application claims the benefit of Korean Patent Application No. 10-2019-0173972, filed on Dec. 24, 2019, which is hereby incorporated by reference in its entirety.

BACKGROUND

Field of the Disclosure

The present disclosure relates to a touch display device, and more particularly to a touch display device for preventing damage to test patterns.

Description of the Background

A touch screen is an input device through which a user may input a command by selecting instructions displayed on a screen of a display device using a hand or an object. That is, a touch screen converts a contact position that directly contacts a human hand or an object into an electrical signal and receives selected instructions based on the contact position as an input signal. Such a touch screen may substitute for a separate input device that is connected to a display device and operated, such as a keyboard or a mouse, and thus the range of application of the touch screen is continually increasing.

Recently, research and development have been actively conducted on a touch display device in which a touch screen is disposed on a display panel, such as a liquid crystal display panel or an organic electroluminescent display panel. However, during the process of manufacturing a touch electrode included in a touch screen, test patterns, which are formed prior to formation of the touch electrode, may be damaged.

SUMMARY

Accordingly, the present disclosure is directed to a touch display device that substantially obviates one or more problems due to limitations and disadvantages of the prior art.

More specifically, the present disclosure provides a touch display device for preventing damage to test patterns.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve the above and other advantages and in accordance with the purpose of the disclosure, as embodied and broadly described herein, a touch display device comprising: a light-emitting element disposed on a substrate; a plurality of touch electrodes disposed on the light-emitting element; a test pattern formed on a peripheral portion of the substrate; and a test cover layer formed of a same material as at least one of a plurality of insulating films disposed between the light-emitting element and the plurality of touch electrodes, the test cover layer being disposed on the test pattern.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the present disclosure, illustrate aspect(s) of the disclosure and together with the description serve to explain the principle of the disclosure.

In the drawings.

DETAILED DESCRIPTION

Reference will now be made in detail to exemplary aspects of the present disclosure, examples of which are illustrated in the accompanying drawings.

Figure 1:
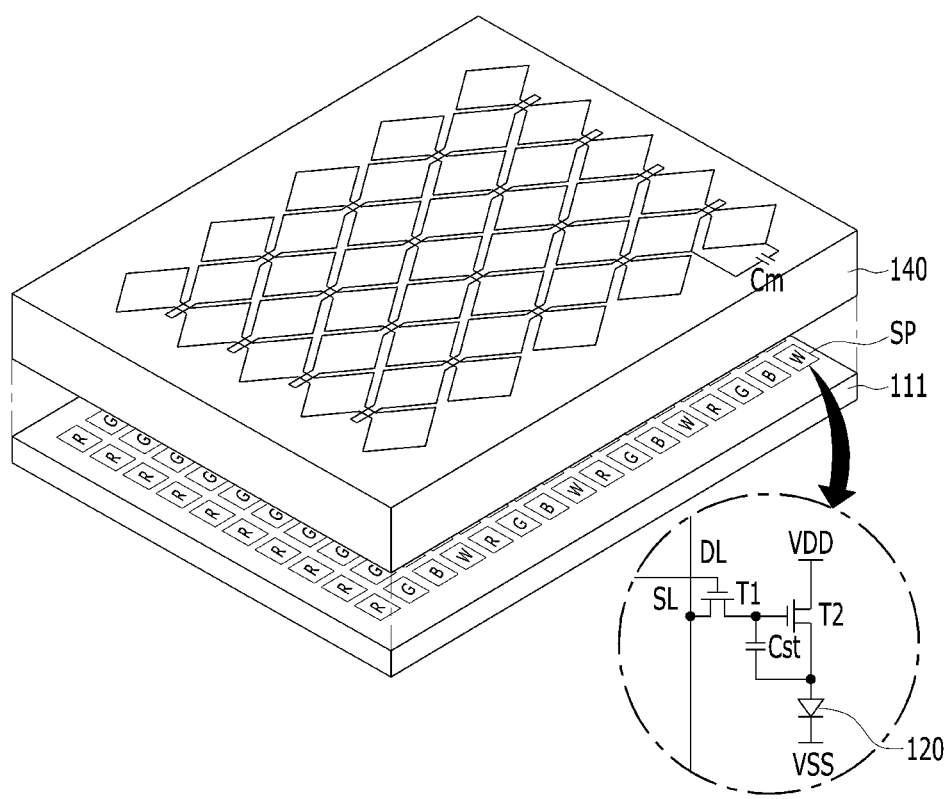
FIG. 1 is a perspective view showing a touch display device according to the present disclosure.

FIG. 1 is a perspective view showing a touch display device according to the present disclosure.

Figure 2:
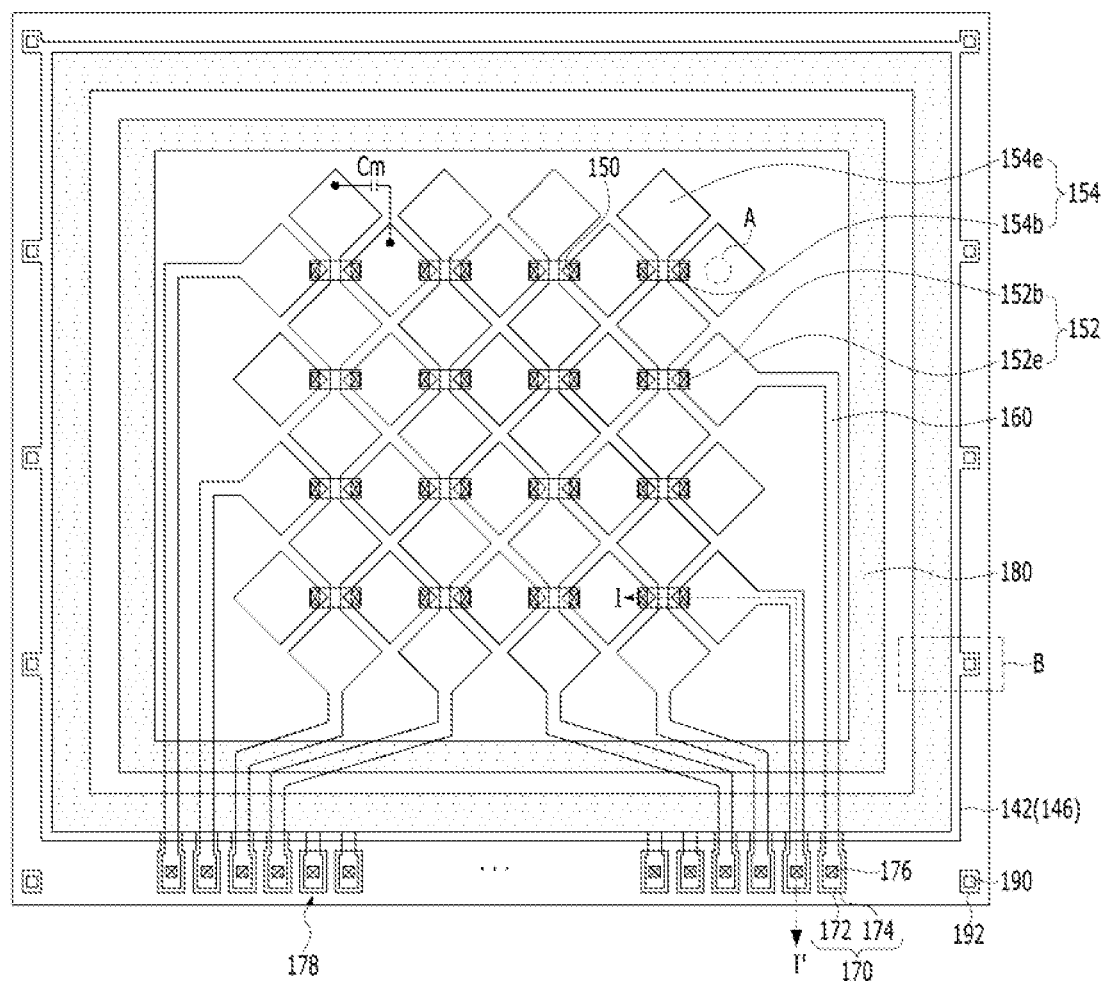
FIG. 2 is a plan view showing the touch display device according to the present disclosure.

A touch display device shown in FIG. 1 senses the presence or absence of a touch and a touch position by sensing variation in mutual capacitance (a touch sensor Cm) in response to a user touch through touch electrodes 152e and 154e shown in FIG. 2 for a touch period. The touch display device shown in FIG. 1 displays an image through a unit pixel including a light-emitting element 120.

To this end, the touch display device includes a unit pixel composed of a plurality of subpixels SP arranged in a matrix form on a substrate 111, an encapsulation unit 140 disposed on the plurality of subpixels SP, and a touch sensor Cm disposed on the encapsulation unit 140.

The unit pixel is composed of subpixels R, green subpixels G and blue subpixels B included in subpixels SP, which are arranged in a row. Alternatively, as shown in FIG. 1, the unit pixel is composed of red subpixel R, green subpixels G, blue subpixels B and white subpixels W included in subpixels SP.

Each of the subpixels SP includes a pixel-driving circuit and a light-emitting element 120 connected to the pixel-driving circuit.

The pixel-driving circuit includes a switching transistor T1, a driving transistor T2, and a storage capacitor Cst. In the present disclosure, a structure in which the pixel-driving circuit includes two transistors T and one capacitor C is described by way of example, but the present disclosure is not limited thereto. That is, a pixel-driving circuit having a 3T1C structure or 3T2C structure in which three or more transistors T and one or more capacitors C are provided may be used.

The switching transistor T1 is turned on when a scan pulse is supplied to a scan line SL, and supplies a data signal supplied to a data line DL to the storage capacitor Cst and a gate electrode of the driving transistor T2.

The driving transistor T2 controls the current I supplied from a high-voltage (VDD) supply line to the light-emitting element 120 in response to the data signal supplied to the gate electrode of the driving transistor T2, thereby adjusting the amount of light emitted from the light-emitting element 120. Even when the switching transistor T1 is turned off, the driving transistor T2 maintains the emission of light by the light-emitting element 120 by supplying a constant amount of current thereto using the voltage charged in the storage capacitor Cst until the data signal of the next frame is supplied.

Figure 3:
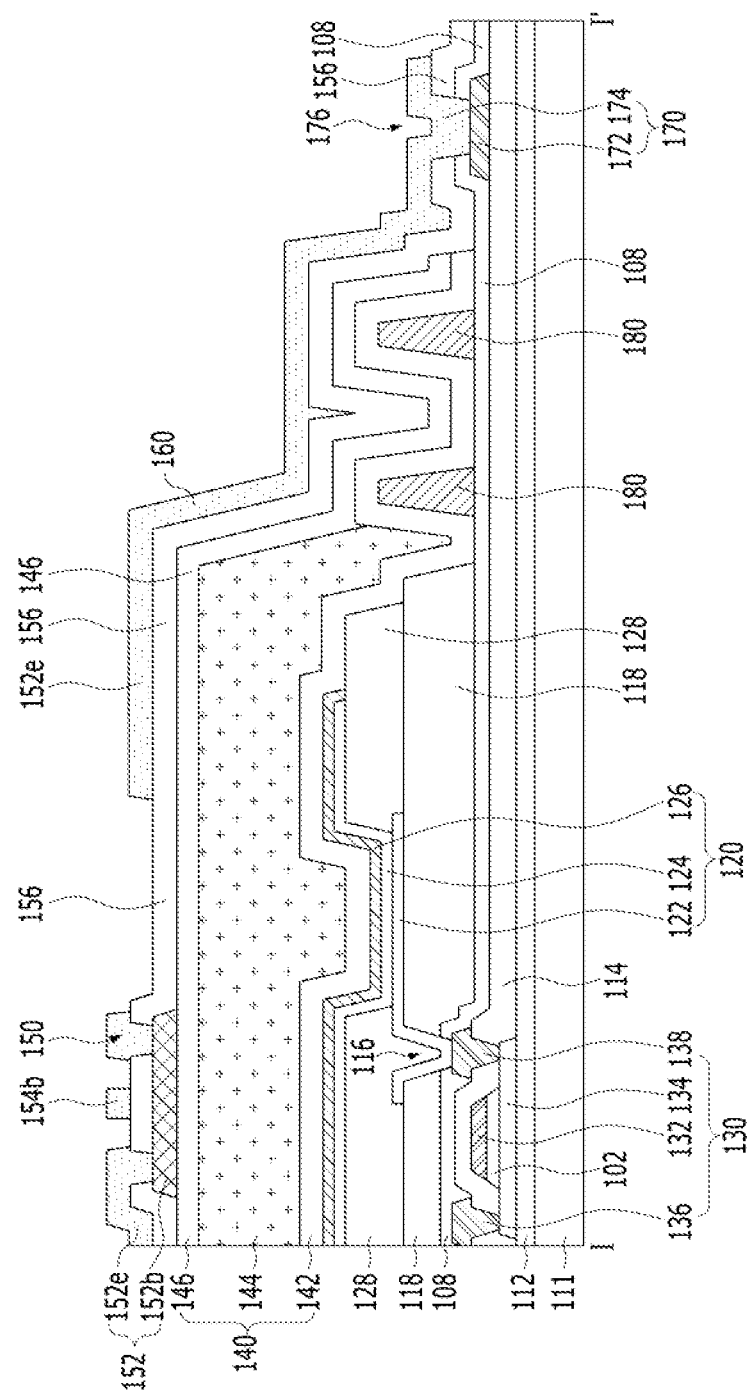
FIG. 3 is a cross-sectional view of the touch display device taken along line I-I' in FIG. 2.

The driving transistor T2 (130), as shown in FIG. 3, includes a semiconductor layer 134 disposed on a buffer layer 112, a gate electrode 132 overlapping the semiconductor layer 134 with a gate insulating film 102 interposed therebetween, and source and drain electrodes 136 and 138 formed on an interlayer insulating film 114 so as to be in contact with the semiconductor layer 134. The semiconductor layer 134 is formed of at least one of an amorphous semiconductor material, a polycrystalline semiconductor material, or an oxide semiconductor material.

The light-emitting element 120 includes an anode 122, a light-emitting stack 124 formed on the anode 122, and a cathode 126 formed on the light-emitting stack 124.

The anode 122 is electrically connected to the drain electrode 138 of the driving transistor T2 (130), which is exposed through a pixel contact hole 116 that penetrates a pixel planarization layer 118.

At least one light-emitting stack 124 is formed on the anode 122 in an emission area that is defined by a bank 128. The at least one light-emitting stack 124 is formed by stacking a hole-related layer, an organic emission layer, and an electron-related layer on the anode 122 in that order or in the reverse order. In addition, the light-emitting stack 124 may include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated through the first and second light-emitting stacks. Since the white light generated in the light-emitting stack 124 is incident on a color filter located above the light-emitting stack 124, a color image may be realized. Alternatively, colored light corresponding to each subpixel may be generated in each light-emitting stack 124 without a separate color filter in order to realize a color image. That is, the light-emitting stack 124 of the red subpixel R may generate red light, the light-emitting stack 124 of the green subpixel G may generate green light, and the light-emitting stack 124 of the blue subpixel B may generate blue light.

The cathode 126 is formed so as to face the anode 122, with the light-emitting stack 124 interposed therebetween. The cathode 126 is connected to a low-voltage (VSS) supply line.

The encapsulation unit 140 prevents external moisture or oxygen from entering the light-emitting element 120, which is vulnerable to external moisture or oxygen. To this end, the encapsulation unit 140 includes a plurality of inorganic encapsulation layers 142 and 146 and an organic encapsulation layer 144 disposed between the plurality of inorganic encapsulation layers 142 and 146. The inorganic encapsulation layer 146 is disposed at the top of the encapsulation unit 140. In this case, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between the first and second inorganic encapsulation layers 142 and 146 will be described by way of example.

The first inorganic encapsulation layer 142 is formed on the substrate 111, on which the cathode 126 has been formed, at the position that is the closest to the light-emitting element 120. The first inorganic encapsulation layer 142 is formed of an inorganic insulating material that is capable of being deposited at a low temperature, such as silicon nitride (SiNx), silicon oxide (SiOx), silicon oxynitride (SiON), or aluminum oxide (Al2O3). Thus, since the first inorganic encapsulation layer 142 is deposited in a low-temperature atmosphere, it is possible to prevent damage to the light-emitting stack 124, which is vulnerable to a high-temperature atmosphere, during the process of depositing the first inorganic encapsulation layer 142.

The organic encapsulation layer 144 serves to dampen the stress between the respective layers due to bending of the organic light-emitting display device and to increase planarization performance. The organic encapsulation layer 144 is formed of an organic insulating material, such as acrylic resin, epoxy resin, polyimide, polyethylene, or silicon oxycarbide (SiOC).

When the organic encapsulation layer 144 is formed through an inkjet method, at least one dam 180 is disposed in order to prevent the organic encapsulation layer 144, which is in a liquid state, from spreading to an edge of the substrate 111. The at least one dam 180 may prevent the organic encapsulation layer 144 from spreading to a pad area formed at the outermost portion of the substrate 111, in which a touch pad 170 and a display pad 178 are disposed. To this end, the at least one dam 180 may be formed so as to completely surround the active area, in which the light-emitting element 120 is disposed, as shown in FIG. 2, or may be formed only between the active area and the pad area. When the pad area, in which the touch pad 170 and the display pad 178 are disposed, is disposed at one side of the substrate 111, the at least one dam 180 is disposed only on the one side of the substrate 111. When the pad area, in which the touch pad 170 and the display pad 178 are disposed, is disposed at opposite sides of the substrate 111, the at least one dam 180 is disposed on the opposite sides of the substrate 111. The at least one dam 180 is formed in a single-layered or multi-layered structure. The at least one dam 180 is formed simultaneously with at least one of the pixel planarization layer 118, the bank 128, or the spacer using the same material.

The second inorganic encapsulation layer 146 is formed on the substrate 111, on which the organic encapsulation layer 144 has been formed, so as to cover the top and side surfaces of each of the organic encapsulation layer 144 and the first inorganic encapsulation layer 142. Accordingly, the second inorganic encapsulation layer 146 minimizes or prevents permeation of external moisture or oxygen into the first inorganic encapsulation layer 142 and the organic encapsulation layer 144. The second inorganic encapsulation layer 146 is formed of an inorganic insulating material, such as silicon nitride (SiNx), silicon oxide (SiOx), silicon oxynitride (SiON), or aluminum oxide (Al2O3).

A touch sensor Cm is disposed on the encapsulation unit 140. The touch sensor Cm includes a touch insulating film 156, and further includes a touch-sensing line 154 and a touch-driving line 152 disposed so as to intersect each other, with the touch insulating film 156 interposed therebetween. The touch sensor charges an electric charge using a touch-driving pulse supplied to the touch-driving line 152, and discharges the electric charge to the touch-sensing line 154.

The touch-driving line 152 includes a plurality of first touch electrodes 152e and first bridges 152b electrically connecting the first touch electrodes 152e to each other.

The first touch electrodes 152e are spaced apart from each other at regular intervals in an X direction, which is a first direction, on the touch insulating film 156. Each of the first touch electrodes 152e is electrically connected to a neighboring first touch electrode 152e via the first bridge 152b.

The first bridge 152b is exposed through a touch contact hole 150 that penetrates the touch insulating film 156, and is electrically connected to the first touch electrode 152e.

The touch-sensing line 154 includes a plurality of second touch electrodes 154e and second bridges 154b electrically connecting the second touch electrodes 154e to each other.

The second touch electrodes 154e are spaced apart from each other at regular intervals in a Y direction, which is a second direction, on the touch insulating film 156. Each of the second touch electrodes 154e is electrically connected to a neighboring second touch electrode 154e via the second bridge 154b.

The second bridge 154b is disposed on the touch insulating film 156, which is coplanar with the second touch electrode 154e, and thus is electrically connected to the second touch electrode 154e without a separate contact hole.

A touch buffer film (not shown) may be disposed between each of the touch-driving line 152 and the touch-sensing line 154 and the encapsulation unit 140. Since the spacing distance between each of the touch-driving line 152 and the touch-sensing line 154 and the cathode 126 is increased by the touch buffer film, the capacitance value of a parasitic capacitor between each of the touch-driving line 152 and the touch-sensing line 154 and the cathode 126 may be reduced.

Figure 4:
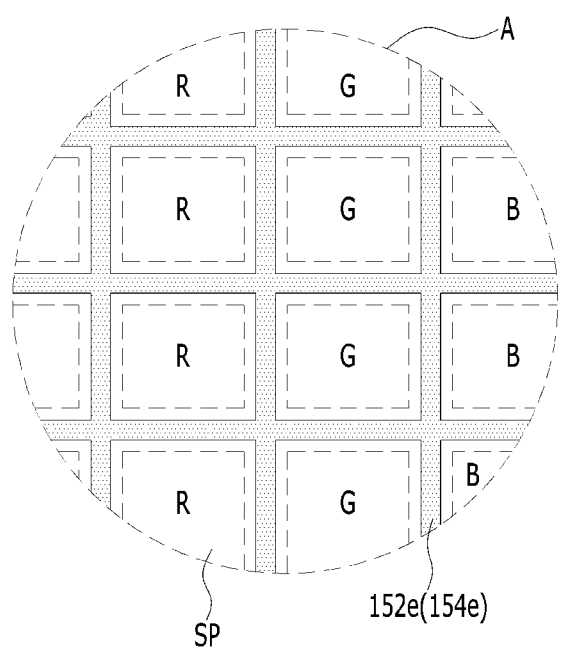
FIG. 4 is an enlarged plan view of region A1 shown in FIG. 2.

As shown in FIG. 4, the first and second touch electrodes 152e and 154e and the first and second bridges 152b and 154b are formed in a mesh type such that they do not overlap the emission area of each subpixel SP and overlap the bank 128. Accordingly, it is possible to prevent an aperture ratio and transmissivity from being deteriorated by the first and second touch electrodes 152e and 154e and the first and second bridges 152b and 154b.

The first and second touch electrodes 152e and 154e and the first and second bridges 152b and 154b have higher conductivity than a transparent conductive film, and thus are formed as low-resistance electrodes. The first and second touch electrodes 152e and 154e and the first and second bridges 152b and 154b are formed in a single-layered or multi-layered structure together with routing lines 160 using a touch metal layer formed of a material having high corrosion resistance and acid resistance and excellent conductivity, such as Ta, Ti, Cu, or Mo. For example, the first and second touch electrodes 152e and 154e, the first and second bridges 152b and 154b, and the routing lines 160 are formed in a three-layered structure such as a stack of Ti/Al/Ti, MoTi/Cu/MoTi, or Ti/Al/Mo. Accordingly, the resistances and capacitances of the first and second touch electrodes 152e and 154e, the first and second bridges 152b and 154b, and the routing lines 160 are reduced. As a result, RC delay is reduced, thus improving touch sensitivity.

According to the present disclosure, each of the touch-driving line 152 and the touch-sensing line 154 is connected to a touch-driving unit (not shown) via the routing line 160 and the touch pad 170.

The touch pad 170 is connected to a signal transmission film (not shown), on which the touch-driving unit is mounted. The touch pad 170 is composed of first and second touch pad electrodes 172 and 174.

The first touch pad electrode 172 is disposed on at least one of the substrate 111, the buffer layer 112, or the interlayer insulating film 114, which is disposed below the encapsulation unit 140. The first touch pad electrode 172 is formed of the same material as at least one of a gate electrode 132, a source electrode 136, or a drain electrode 138 of a driving transistor T2 (130) in the same plane, and has a single-layered or multi-layered structure. For example, since the first touch pad electrode 172 is formed of the same material as the source and drain electrodes 136 and 138 and is disposed on the interlayer insulating film 114, the first touch pad electrode 172 is formed through the same mask process as the source and drain electrodes 136 and 138.

The second touch pad electrode 174 is electrically connected to the first touch pad electrode 172, which is exposed through a pad contact hole 176 that penetrates a pixel protective film 108 and the touch insulating film 156. Since the second touch pad electrode 174 is formed through the same mask process as the routing line 160, the second touch pad electrode 174 is formed of the same material as the routing line 160 in the same plane.

The second touch pad electrode 174 extends from the routing line 160, and is connected to a signal transmission film (not shown), on which the touch-driving unit is mounted, via an anisotropic conductive film (not shown).

A display pad 178 is also disposed in a non-active area (a bezel), in which the touch pad 170 is disposed. For example, as shown in FIG. 2, display pads 178 may be disposed between touch pads 170, or the touch pads 170 may be disposed between the display pads 178. Alternatively, the touch pad 170 may be disposed at one side of the display panel, and the display pad 178 may be disposed at the opposite side of the display panel. However, the arrangement of the touch pad 170 and the display pad 178 is not limited to the structure shown in FIG. 2, and may be variously changed depending on the design requirements of the display device.

The display pad 178 is formed in a stack structure different from that of the touch pad 170, or is formed in the same stack structure as the touch pad 170 shown in FIG. 3.

The routing line 160 transmits a touch-driving pulse generated in the touch-driving unit to the touch-driving line 152 through the touch pad 170, and transmits a touch signal from the touch-sensing line 154 to the touch-driving unit through the touch pad 170. Accordingly, the routing line 160 is formed between each of the first and second touch electrodes 152e and 154e and the touch pad 170 to electrically connect each of the first and second touch electrodes 152e and 154e to the touch pad 170. As shown in FIG. 2, the routing line 160 extends from the first touch electrode 152e to at least one of the left side or the right side of the active area AA, and is connected to the touch pad 170. In addition, the routing line 160 extends from the second touch electrode 154e to at least one of the upper side or the lower side of the active area, and is connected to the touch pad 170. This arrangement of the routing line 160 may be variously changed depending on the design requirements of the display device. The routing line 160 is disposed above the at least one dam 180 so as to intersect the at least one dam 180.

The routing line 160 is formed together with at least one of the first bridge 152b or the second bridge 154b, and is formed in a single-layered or multi-layered structure. The routing line 160 has a multi-layered structure including an upper line and a lower line, which are disposed in different layers from each other. The upper line and the lower line are electrically connected to each other through a contact hole. For example, the routing line 160 includes a lower line, which is formed of the same material as the first bridge 152b and is disposed in the same plane, and an upper line, which is formed of the same material as the second bridge 154b and is disposed in the same plane. The upper line and the lower line are electrically connected to each other through a contact hole that penetrates the touch insulating film 156.

As show in FIG. 2, test element groups (TEGs, hereinafter referred to as "test patterns 190") are formed in a bezel area between the outer side of the dam 180 and the edge of the substrate 111. The test patterns 190 are formed in a bezel area corresponding to the upper/lower/left/right portions of the substrate 111 or the corner portions of the substrate 111.

The test patterns 190 are used to measure the thickness, resistance, concentration, degree of contamination, and critical dimension of a product formed in each process and the electrical properties of the device in order to determine whether each process of manufacturing the touch display device has been properly performed. The test patterns 190 are formed together with the respective thin-film layers formed on the substrate 111 through the same manufacturing process. Subsequently, each of the test patterns 190 is inspected or monitored in order to evaluate the reliability, the stability, and the process margin of the corresponding process.

The test patterns 190 are formed in the bezel area through the same manufacturing process as each of the thin-film layers included in the light-emitting stack 124, such as a hole transport layer (pHTL) doped with a p-type dopant, a hole transport layer (HTL) in which no dopant is doped, an electron transport layer (ETL), a hole-blocking layer (HBL), and an electron-blocking layer (EBL), a capping layer (CPL) having a multi-layered structure, and the cathode 126 having a multi-layered structure.

Some of the test patterns 190 are torn out during the process of manufacturing the touch conductive layers disposed on the encapsulation unit 140 (e.g. the touch electrodes 152e and 154e, the bridges 152b and 154b, the routing lines 160, and the second touch pad electrode 174). Therefore, according to the present disclosure, as shown in FIGS. 5A to 7B, a test cover layer 192 is provided to protect the test patterns 190, which are likely to be torn out, thereby preventing the test patterns 190 from being damaged during the processes of manufacturing the touch conductive layers.

Described in detail, as shown in FIGS. 5A to 7B, the test patterns 190 are divided into first and second test patterns 190a and 190b. For example, the first test patterns 190a are formed through the same manufacturing process as the cathode conductive layer disposed at the top among the multiple layers included in the cathode 126. The second test patterns 190b are formed through the same manufacturing process as at least one of the hole transport layer (pHTL) doped with a p-type dopant, the hole transport layer (HTL) in which no dopant is doped, the electron transport layer (ETL), the hole-blocking layer (HBL), the electron-blocking layer (EBL), or the capping layers (CPL) having a multi-layered structure.

Among the test patterns 190, the first test patterns 190a are used to measure the thickness, resistance, and electrical properties of the cathode 126. The first test patterns 190a are torn out during the process of depositing the touch conductive layer due to the low adhesive force between the first test patterns 190a and the thin-film layer disposed thereunder. However, the first test patterns 190a are not capable of being removed through a stripping process, which causes defects attributable to foreign substances (e.g. short circuits).

Among the second test patterns 190b, a second test pattern 190b, which is used to measure the thickness, resistance, and electrical properties of each of the lower capping layer, the hole-blocking layer HBL, and the electron transport layer (ETL), is torn out during the process of depositing the touch conductive layer due to the low adhesive force between the second test pattern 190b and the thin-film layer disposed thereunder. This second test pattern 190b is capable of being removed through a stripping process, thereby avoiding defects attributable to foreign substances.

Among the second test patterns 190b, a second test pattern 190b, which is used to measure the thickness, resistance, and electrical properties of each of the upper capping layer, the hole transport layer (pHTL) doped with a p-type dopant, the hole transport layer (HTL) in which no dopant is doped, and the electron-blocking layer (EBL), is prevented from being torn out during the process of depositing the touch conductive layer due to the high adhesive force between the second test pattern 190b and the thin-film layer disposed thereunder.

The test cover layer 192 is formed to cover the test patterns 190 before the process of manufacturing the touch conductive layers so as to prevent damage to the test patterns 190 during the process of manufacturing the touch conductive layers. To this end, the test cover layer 192 is formed in a single-layered or multi-layered structure using the same material as at least one of the insulating films disposed between the light-emitting element 120 and the touch conductive layers. The test cover layer 192 is formed together with at least one of the first inorganic encapsulation layer 142 or the second inorganic encapsulation layer 146 included in the encapsulation unit 140 using the same material, is formed together with the organic encapsulation layer 144 using the same material, or is formed together with each of the first and second inorganic encapsulation layers 142 and 146 and the organic encapsulation layer 144 using the same material. For example, as shown in FIGS. 5B, 6B and 7B, the test cover layer 192 is composed of a first test cover layer 192a and a second test cover layer 192b, which are formed together with the first inorganic encapsulation layer 142 and the second inorganic encapsulation layer 146, respectively, using the same materials as the first inorganic encapsulation layer 142 and the second inorganic encapsulation layer 146.

Figure 5A:
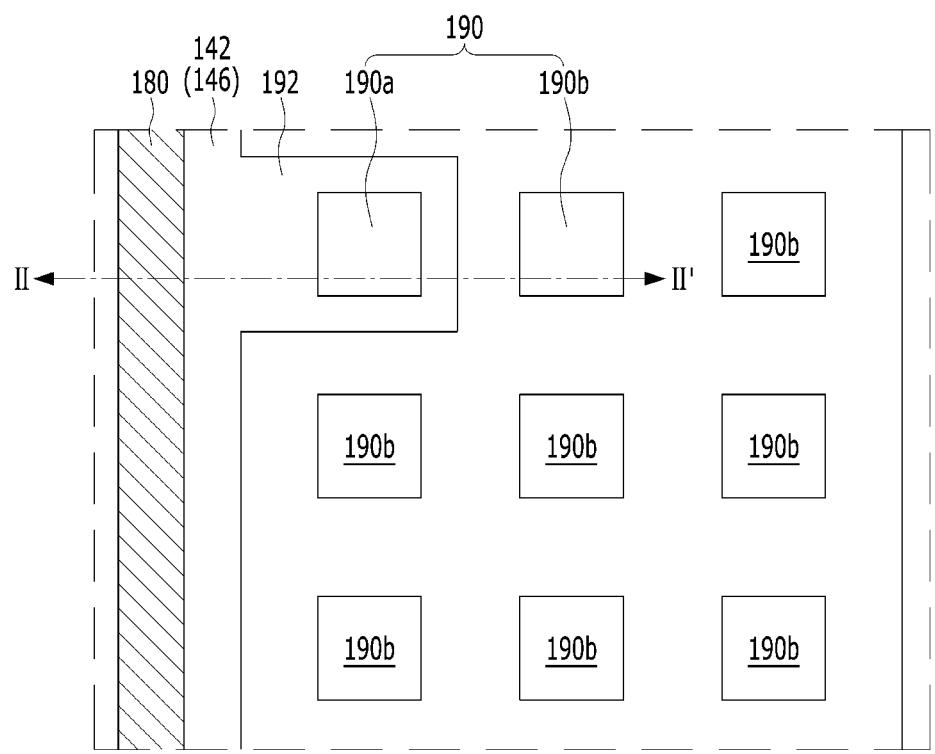
FIGS. 5A and 5B are a plan view and a cross-sectional view showing a first aspect of a test pattern and a test cover layer in region A2 shown in FIG. 2.
Figure 5B:
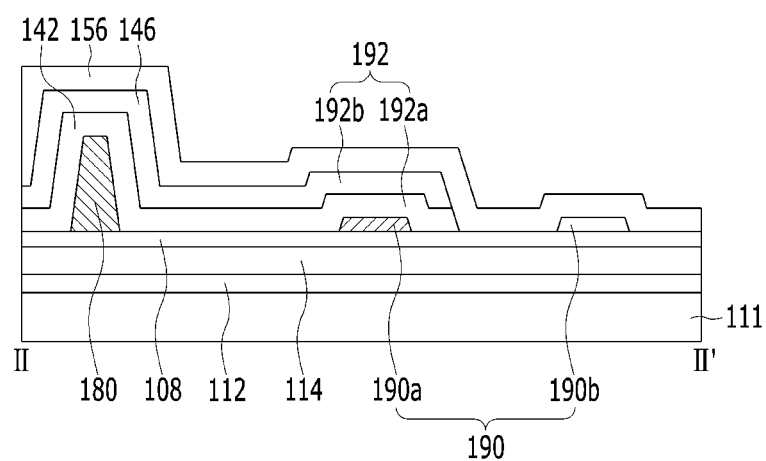
Figure 6A:
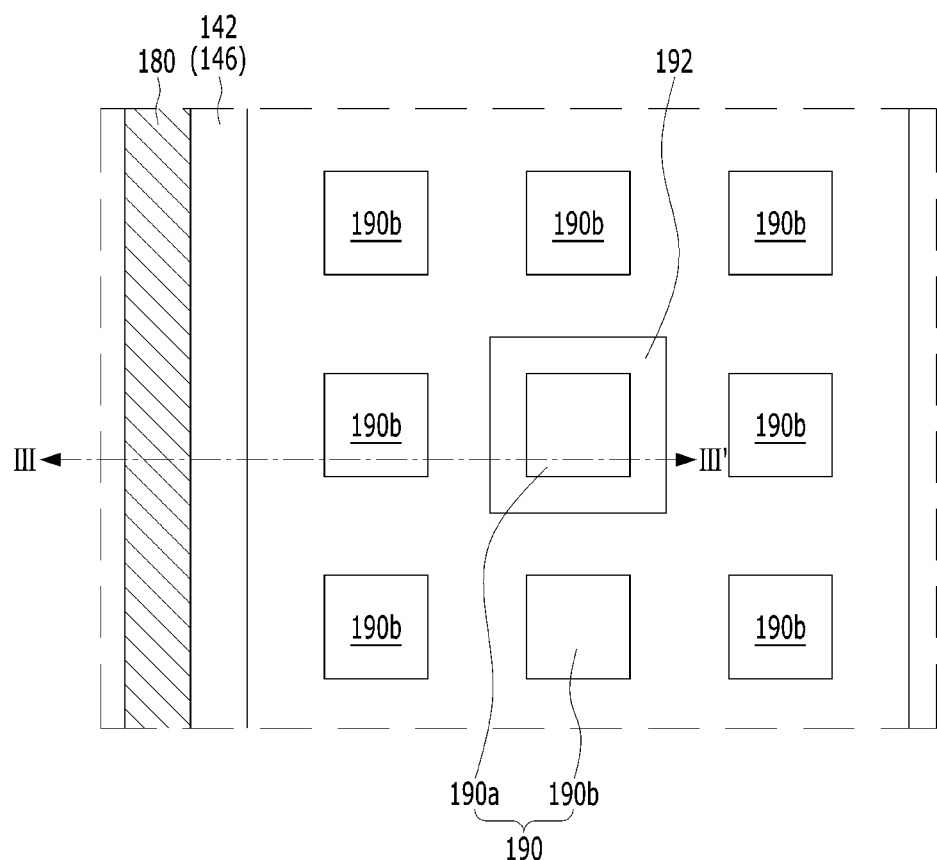
FIGS. 6A and 6B are a plan view and a cross-sectional view showing a second aspect of a test pattern and a test cover layer in region A2 shown in FIG. 2.
Figure 6B:
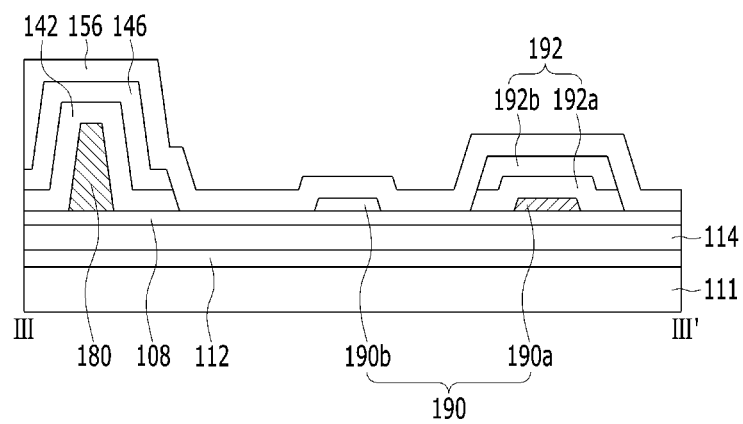
Figure 7A:
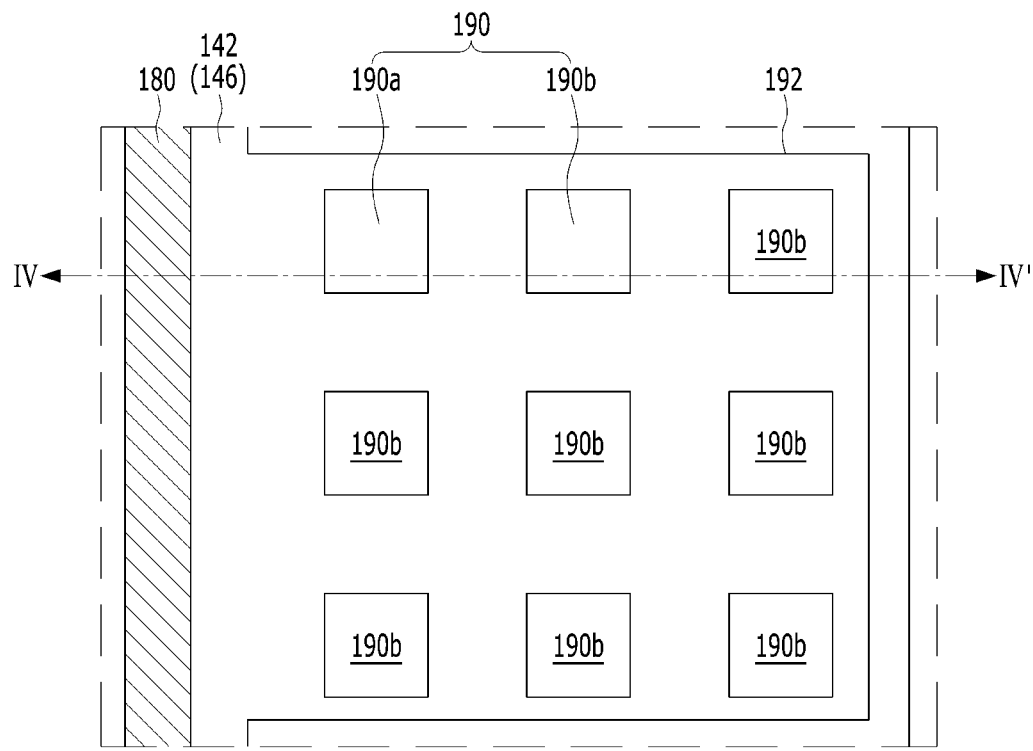
FIGS. 7A and 7B are a plan view and a cross-sectional view showing a third aspect of a test pattern and a test cover layer in region A2 shown in FIG. 2.
Figure 7B:
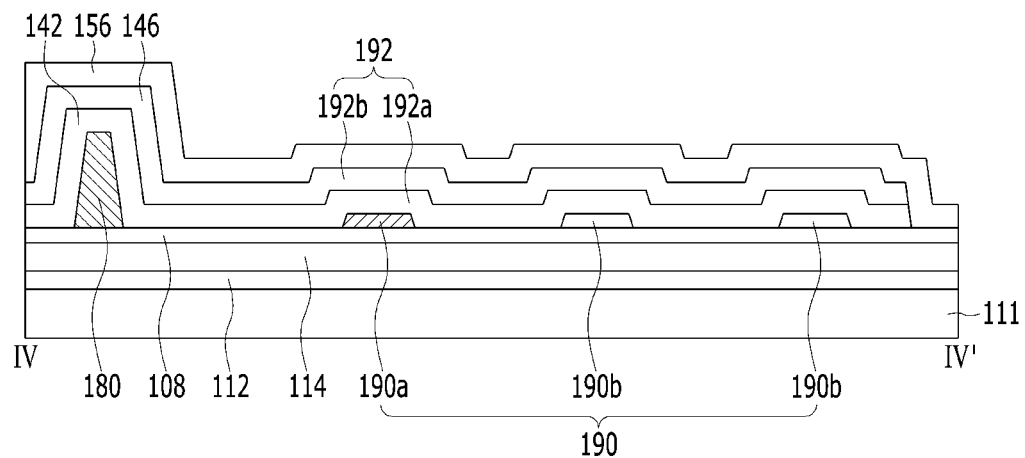

According to the present disclosure, the test cover layer 192 and the test patterns 190 have the structure of the first aspect shown in FIGS. 5A and 5B, the structure of the second aspect shown in FIGS. 6A and 6B, or the structure of the third aspect shown in FIGS. 7A and 7B.

The first test pattern 190a shown in FIGS. 5A and 5B is disposed adjacent to the dam 180. The first test pattern 190a is protected by the test cover layer 192, which extends from the first and second inorganic encapsulation layers 142 and 146 formed on the outer side surface of the outermost dam. In this case, the first and second inorganic encapsulation layers 142 and 146 and the test cover layers 192a and 192b are formed together using a deposition mask having first and second openings formed therein. The first opening corresponds to the region in which the first and second inorganic encapsulation layers 142 and 146 are formed, and the second opening is connected to the first opening, and corresponds to the region in which the test cover layers 192a and 192b are formed.

Accordingly, the first test pattern 190a overlaps the test cover layer 192, and is thus prevented from being torn out during the process of manufacturing the touch conductive layer. In addition, although the second test pattern 190b does not overlap the test cover layer 192, the second test pattern 190b is prevented from being torn out during the process of manufacturing the touch conductive layer because the adhesive force between the second test pattern 190b and the thin-film layer disposed thereunder is high or the second test pattern 190b is capable of being removed through a stripping process.

The first test pattern 190a shown in FIGS. 6A and 6B is disposed far from the dam 180. The first test pattern 190a is protected by the test cover layer 192, which is spaced apart from the first and second inorganic encapsulation layers 142 and 146 formed on the outer side surface of the outermost dam. In this case, the first and second inorganic encapsulation layers 142 and 146 and the test cover layers 192a and 192b are formed together using a deposition mask having first and second openings formed therein. The first opening corresponds to the region in which the first and second inorganic encapsulation layers 142 and 146 are formed, and the second opening is spaced apart from the first opening, and corresponds to the region in which the test cover layers 192a and 192b are formed.

Accordingly, the first test pattern 190a overlaps the test cover layer 192, and is thus prevented from being torn out during the process of manufacturing the touch conductive layer. In addition, although the second test pattern 190b does not overlap the test cover layer 192, the second test pattern 190b is prevented from being torn out during the process of manufacturing the touch conductive layer because the adhesive force between the second test pattern 190b and the thin-film layer disposed thereunder is high or the second test pattern 190b is capable of being removed through a stripping process.

The first test pattern 190a shown in FIGS. 7A and 7B is disposed close to or far from the dam 180. The first test pattern 190a and the second test pattern 190b are protected by the test cover layer 192. In this case, the test cover layer 192 may be disposed adjacent to a trimming line, which is the edge of the substrate 111, or may be formed so as to extend to the trimming line, which is the edge of the substrate 111. Accordingly, the first and second test patterns 190a and 190b overlap the test cover layer 192, thus preventing the first and second test patterns 190a and 190b from being torn out during the process of manufacturing the touch conductive layer.

Although the present disclosure has been described taking as an example thereof test patterns formed through the same process as the light-emitting element, the present disclosure is also applicable to test patterns formed through the same process as a thin-film transistor.

Although the present disclosure has been described by way of example as having a mutual-capacitance-type touch sensor structure, the present disclosure is not limited thereto. The present disclosure can also be applied to a self-capacitance-type touch sensor structure. That is, each of the plurality of touch electrodes includes a capacitance formed therein, and thus is used as a self-capacitance-type touch sensor that senses variation in capacitance due to a user touch. Each of the touch electrodes is connected to a respective one of the routing lines in one-to-one correspondence. Each of the touch electrodes is electrically connected to a corresponding one of the routing lines, and is not connected to the remaining routing lines. For example, the $m^{th}$ touch electrode (where "m" is a natural number) is electrically connected to the $m^{th}$ routing line, and is not connected to the remaining routing lines other than the $m^{th}$ routing line. The $m+1^{th}$ touch electrode is electrically connected to the $m+1^{th}$ routing line, and is not connected to the remaining routing lines other than the $m+1^{th}$ routing line. In this case, the routing lines may be disposed across the touch electrodes, or may be disposed between the touch electrodes. The routing lines are disposed in a different layer from the touch electrodes, with the touch insulating film interposed therebetween, and thus are electrically connected to the touch electrodes through the contact holes, which penetrate the touch insulating film. Alternatively, the routing lines may be disposed in the same layer as the touch electrodes, and thus may be directly connected to the touch electrodes without separate contact holes.

A touch display device according to various aspects of the present disclosure may be described as follows.

The touch display device according to the present disclosure includes a light-emitting element disposed on a substrate, a plurality of touch electrodes disposed on the light-emitting element, a test pattern formed on a peripheral portion of the substrate, and a test cover layer formed of the same material as at least one of a plurality of insulating films disposed between the light-emitting emitting element and the plurality of touch electrodes, the test cover layer being disposed on the test pattern.

The insulating films are encapsulation units disposed between the light-emitting element and the plurality of touch electrodes. The encapsulation units include first and second inorganic encapsulation layers disposed on the light-emitting element and an organic encapsulation layer disposed between the first and second inorganic encapsulation layers.

The test cover layer is formed of the same material as at least one of the first inorganic encapsulation layer, the second inorganic encapsulation layer, or the organic encapsulation layer.

The test cover layer extends from at least one of the first inorganic encapsulation layer or the second inorganic encapsulation layer, or is spaced apart from at least one of the first inorganic encapsulation layer, the second inorganic encapsulation layer, or the organic encapsulation layer.

The test pattern includes a first test pattern disposed to overlap the test cover layer and a second test pattern disposed to overlap or to avoid overlapping the test cover layer. The first test pattern is formed of the same material as a cathode of the light-emitting element, and the second test pattern is formed of the same material as at least one component included in a light-emitting stack of the light-emitting element.

The touch display device according to the present disclosure further includes a dam forming a boundary with the organic encapsulation layer. The first test pattern and the second test pattern are disposed between the dam and an edge of the substrate.

As is apparent from the above description, a touch display device according to the present disclosure includes a test cover layer formed so as to cover test patterns, which are used to monitor the characteristics of a light-emitting stack and a cathode included in a light-emitting element, thereby preventing damage to the test patterns during the process of manufacturing a touch sensor.

In addition, among the test patterns, a test pattern, which is not capable of being removed through a stripping process, is protected by the test cover layer, thereby preventing the test patterns from being torn out and consequently improving the reliability of the product.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A touch display device comprising:
    a light-emitting element disposed on a substrate, and including an anode, a light-emitting stack on the anode, and a cathode on the light-emitting stack;
    an encapsulation unit including a first inorganic encapsulation layer on the light-emitting element, a second inorganic encapsulation layer on the first inorganic encapsulation layer, and the organic encapsulation layer disposed between the first and second inorganic encapsulation layer;
    a plurality of touch electrodes disposed on the encapsulation unit;
    a first test pattern formed on a peripheral portion of the substrate, and formed of a same material as the cathode disposed on the light-emitting stack to measure at least one of a thickness, resistance and electrical properties of the cathode; and
    a test cover layer formed of a same material as at least one of the encapsulation unit disposed between the light-emitting element and the plurality of touch electrodes, wherein the test cover layer is disposed on the first test pattern, and covering the first test pattern.

2. The touch display device according to claim 1, wherein the test cover layer is extended from at least one of the first inorganic encapsulation layer and the second inorganic encapsulation layer.

3. The touch display device according to claim 1, wherein the test cover layer is spaced apart from at least one of the first inorganic encapsulation layer, the second inorganic encapsulation layer and the organic encapsulation layer.

4. The touch display device according to claim 1,
    further comprising a second test pattern arranged separately from the first test pattern,
    wherein the second test pattern is formed of a same material as at least one component included in a light-emitting stack of the light-emitting element.

5. The touch display device according to claim 4, further comprising a dam forming a boundary with the organic encapsulation layer,
    wherein the first test pattern and the second test pattern are disposed between the dam and an edge of the substrate.

6. The touch display device according to claim 5, wherein the test cover layer is extended more towards at least one of the first test pattern and the second test pattern than the dam.

7. The touch display device according to claim 1, further comprising a touch pad electrically connected to the plurality of touch electrodes.

8. The touch display device according to claim 7, further comprising a touch insulating film disposed on the encapsulation units.

9. The touch display device according to claim 8, wherein the touch pad comprises:
    a first touch pad electrode on the substrate; and
    a second touch pad electrode connected to the first touch pad electrode and disposed on the touch insulating film.

10. The touch display device according to claim 1, wherein at least one of the first and second inorganic encapsulation layers has a first side surface protruding more than a second side surface of the organic encapsulation layer.

11. The touch display device according to claim 6, wherein the first and second inorganic encapsulation layers are extended more toward the touch pad than the organic encapsulation layer.

12. A touch display device comprising:
    a light-emitting element disposed on a substrate, and including an anode, a light-emitting stack on the anode, and a cathode on the light-emitting stack;
    a plurality of touch electrodes disposed on the light-emitting element;
    a first test pattern formed on a peripheral portion of the substrate, and formed of a same material as the cathode disposed on the light-emitting stack to measure at least one of a thickness, resistance and electrical properties of the cathode; and
    a test cover layer formed of a same material as at least one of a plurality of insulating films disposed between the light-emitting element and the plurality of touch electrodes; and
    a dam forming a boundary with the plurality of insulating films,
    wherein the test pattern is disposed between the dam and an edge of the substrate.

13. The touch display device according to claim 12,
    further comprising a second test pattern arranged separately from the first test pattern, and
    wherein the second test pattern is formed of a same material as at least one component included in a light-emitting stack of the light-emitting element.

14. The touch display device according to claim 12, further comprising a touch pad electrically connected to the plurality of touch electrodes.

15. The touch display device according to claim 14, further comprising a touch insulating film disposed on the plurality of insulating films.

* * * * *